(12) United States Patent
Mautner et al.

(10) Patent No.: US 11,353,918 B2
(45) Date of Patent: Jun. 7, 2022

(54) ASYNCHRONOUS TIMING EXCHANGE FOR REDUNDANT CLOCK SYNCHRONIZATION

(71) Applicant: THE CHARLES STARK DRAPER LABORATORY, INC., Cambridge, MA (US)

(72) Inventors: Eric Karl Mautner, Hudson, MA (US); Brianna Klingensmith, Arlington, MA (US)

(73) Assignee: THE CHARLES STARK DRAPER LABORATORY, INC., Cambridge, MA (US)

(*) Notice: Subject to any disclaimer, the term of this patent is extended or adjusted under 35 U.S.C. 154(b) by 417 days.

(21) Appl. No.: 16/522,137

(22) Filed: Jul. 25, 2019

(65) Prior Publication Data

US 2020/0099382 A1  Mar. 26, 2020

Related U.S. Application Data

(60) Provisional application No. 62/736,585, filed on Sep. 26, 2018, provisional application No. 62/736,589, filed on Sep. 26, 2018, provisional application No. 62/736,579, filed on Sep. 26, 2018, provisional application No. 62/736,592, filed on Sep. 26, 2018.

(51) Int. Cl.
*G06F 1/14* (2006.01)
*G06F 1/12* (2006.01)
*G06F 13/12* (2006.01)
*H03L 7/081* (2006.01)
*H03L 7/099* (2006.01)
*H04L 7/00* (2006.01)
*G06F 13/42* (2006.01)

(52) U.S. Cl.
CPC .......... *G06F 1/14* (2013.01); *G06F 1/12* (2013.01); *G06F 13/122* (2013.01); *H03L 7/0814* (2013.01); *H03L 7/0991* (2013.01); *H04L 7/0025* (2013.01); *H04L 7/0037* (2013.01); *G06F 13/42* (2013.01)

(58) Field of Classification Search
CPC . G06F 1/14; G06F 1/12; G06F 13/122; G06F 13/42; H04L 7/0814; H04L 7/0025; H04L 7/0037; H03L 7/0991; H03L 7/0814
See application file for complete search history.

(56) References Cited

U.S. PATENT DOCUMENTS

| | | |
|---|---|---|
| 5,557,623 A | 9/1996 | Discoll |
| 8,675,665 B2 | 3/2014 | Umayabashi et al. |
| 10,205,586 B2 | 2/2019 | Paul et al. |
| 10,423,468 B2 | 9/2019 | Doyle et al. |
| 2009/0040920 A1 | 2/2009 | Malekpour |
| 2009/0102534 A1 | 4/2009 | Schmid et al. |
| 2009/0316847 A1 | 12/2009 | Thomsen |

(Continued)

OTHER PUBLICATIONS

Watt, Steve T. et al., "Understanding and Applying Precision Time Protocol", Saudi Arabia Smart Grid 2015, Jeddah, Saudi Arabia, Dec. 7-9, 2015, pp. 1-8.

*Primary Examiner* — Walter J Divito
*Assistant Examiner* — Anthony Luo
(74) *Attorney, Agent, or Firm* — Lando & Anastasi, LLP

(57) ABSTRACT

The present disclosure relates to systems and methods to maintain clock synchronization of multiple computers, or computer systems, through the exchange of communication messages that include clock and/or timing information.

17 Claims, 4 Drawing Sheets

(56) References Cited

U.S. PATENT DOCUMENTS

| | | |
|---|---|---|
| 2010/0019811 A1 | 1/2010 | Malekpour |
| 2012/0030495 A1* | 2/2012 | Chandhoke ............... G06F 1/10 |
| | | 713/400 |
| 2012/0221889 A1 | 8/2012 | Beilin et al. |
| 2015/0071309 A1* | 3/2015 | Aweya .................. H04J 3/0682 |
| | | 370/503 |
| 2015/0092797 A1 | 4/2015 | Aweya |
| 2015/0110231 A1* | 4/2015 | Alexander .......... H04L 27/2675 |
| | | 375/362 |
| 2016/0095078 A1 | 3/2016 | Kamada |
| 2016/0197719 A1* | 7/2016 | Wang ........................ H04L 7/04 |
| | | 709/248 |
| 2017/0064606 A1 | 3/2017 | Lam et al. |
| 2017/0288801 A1 | 10/2017 | Aweya |
| 2019/0036631 A1 | 1/2019 | Markovic et al. |
| 2020/0383076 A1 | 12/2020 | Kim et al. |

\* cited by examiner

ASYNCHRONOUS TIMING EXCHANGE FOR REDUNDANT CLOCK SYNCHRONIZATION

CROSS-REFERENCE TO RELATED APPLICATIONS

This application claims priority to U.S. Provisional Application Ser. No. 62/736,579, titled "ASYNCHRONOUS TIMING EXCHANGE FOR REDUNDANT CLOCK SYNCHRONIZATION," filed on Sep. 26, 2018, U.S. Provisional Application Ser. No. 62/736,585, titled "MULTI-DEVICE ASYNCHRONOUS TIMING EXCHANGE FOR REDUNDANT CLOCK SYNCHRONIZATION," filed on Sep. 26, 2018, U.S. Provisional Application Ser. No. 62/736,589, titled "BYZANTINE ASYNCHRONOUS TIMING EXCHANGE FOR MULTI-DEVICE CLOCK SYNCHRONIZATION," filed on Sep. 26, 2018, and U.S. Provisional Application Ser. No. 62/736,592, titled "BYZANTINE FAILOVER OF CLOCK SYNCHRONIZATION," filed on Sep. 26, 2018, each of which is incorporated herein by reference in its entirety.

FEDERALLY SPONSORED RESEARCH

This invention was made with government support under Contract No. NNJ16GX07B awarded by NASA. The government has certain rights in the invention.

BACKGROUND

Various computing devices may include clocks. Computing devices' clocks control certain aspects of operation of the computing devices. For example, a clock rate of a clock may control a frequency at which components of the computing devices operate.

SUMMARY OF INVENTION

Various aspects of the disclosure provide a computing system comprising an oscillator configured to provide an oscillating signal, a counter coupled to the oscillator and configured to maintain a running total of cycles of the oscillating signal, the running total of cycles being a system clock, a communications interface configured to send and receive information, and a processing component configured to communicate with at least two other computing systems, determine a time differential with respect to each of the at least two other computing systems, maintain a synchronized clock with a selected one of the at least two other computing systems, monitor for a failure criterion with respect to the selected computing system, and re-synchronize the synchronized clock with an alternate one of the at least two other computing systems using the time differential with respect to the alternate one of the at least two other computing systems upon detecting the failure criterion.

In various examples, the processing component is further configured to maintain the synchronized clock based upon the system clock and a first offset value derived from the time differential with respect to the selected computing system, and replace the first offset value with a second offset value derived from the time differential with respect to the alternate computing system responsive to detecting the failure criterion. In some examples, the processing component is further configured to derive the first offset value based upon a first time differential to the selected computing system and a second time differential from the selected computing system.

In some examples, the processing component is further configured to derive the first offset value as an average of a difference between the first time differential and the second time differential. In at least one example, the processing component is further configured to maintain derived values of the first offset value and the second offset value simultaneously. In various examples, the failure criterion is based upon the first offset value. In at least one example, the failure criterion is satisfied where a rate at which the first offset value changes exceeds a threshold.

In various aspects, a method of operating a computing system having a system clock is provided, the method comprising communicating with at least two other computing systems, determining a time differential with respect to each of the at least two other computing systems, maintaining a synchronized clock with a selected one of the at least two other computing systems, monitoring for a failure criterion with respect to the selected computing system, and re-synchronizing the synchronized clock with an alternate one of the at least two other computing systems using the time differential with respect to the alternate one of the at least two other computing systems upon detecting the failure criterion.

In various examples, the method includes maintaining the synchronized clock based upon the system clock and a first offset value derived from time differentials with respect to the selected computing system, and replacing the first offset value with a second offset value derived from time differentials with respect to the alternate computing system responsive to detecting the failure criterion. In at least one example, the method includes deriving the first offset value based upon a first time differential to the selected computing system and a second time differential from the selected computing system.

In some examples, the method includes deriving the first offset value as an average of a difference between the first time differential and the second time differential. In various examples, the method includes maintaining derived values of the first offset value and the second offset value simultaneously. In at least one example, the failure criterion is based upon the first offset value. In some examples, the method includes determining that the failure criterion is satisfied where a rate at which the first offset value changes exceeds a threshold.

In various examples, a non-transitory computer-readable medium storing thereon sequences of computer-executable instructions for operating a computer system having a system clock, the sequences of computer-executable instructions including instructions that instruct at least one processor to communicate with at least two other computing systems, determine a time differential with respect to each of the at least two other computing systems, maintain a synchronized clock with a selected one of the at least two other computing systems, monitor for a failure criterion with respect to the selected computing system, and re-synchronize the synchronized clock with an alternate one of the at least two other computing systems using the time differential with respect to the alternate one of the at least two other computing systems upon detecting the failure criterion.

In some examples, the instructions are further configured to instruct the at least one processor to maintain the synchronized clock based upon the system clock and a first offset value derived from time differentials with respect to the selected computing system, and replace the first offset value with a second offset value derived from time differentials with respect to the alternate computing system responsive to detecting the failure criterion. In various examples, the instructions are further configured to instruct the at least one processor to derive the first offset value based upon a first e differential to the selected computing system and a second time differential from the selected computing system.

In at least one example, the instructions are further configured to instruct the at least one processor to derive the first offset value as an average of a difference between the first time differential and the second time differential. In some examples, the instructions are further configured to instruct the at least one processor to maintain derived values of the first offset value and the second offset value simultaneously. In various examples, the failure criterion is satisfied where a rate at which the first offset value changes exceeds a threshold.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures may be represented by a like or similar numeral. For purposes of clarity, not every component may be labeled in every figure. In the figures.

DETAILED DESCRIPTION

Figure 1:
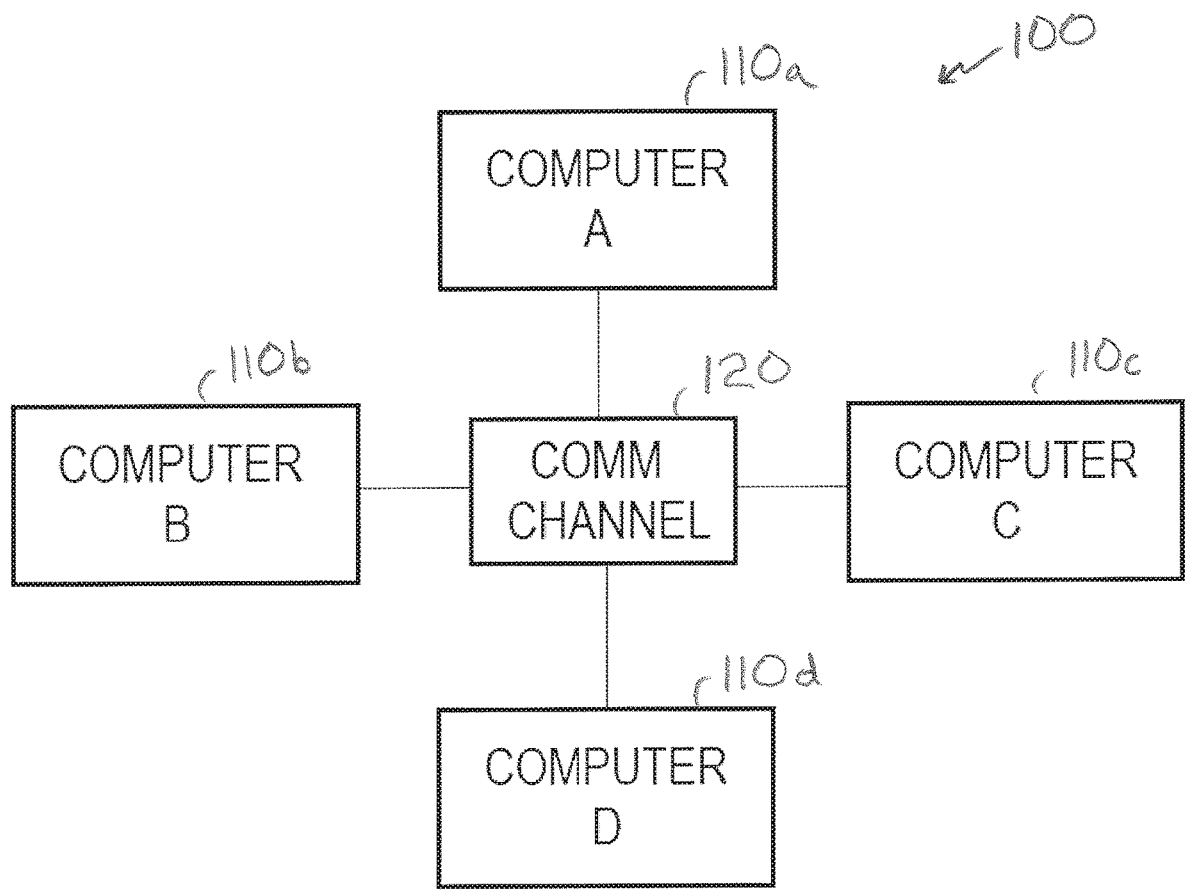
FIG. 1 is a schematic block diagram of an example fault tolerant computing system.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

With the rapid technological developments in areas such as aviation, space travel, robotics, medical devices, and electronic financial systems, there is an increasing need for computer systems to be reliable and resilient to failure. Thus, there is an ever-growing demand for reliable computing systems. Replicated computers executing redundant operations can provide fault tolerance by comparing the outputs of each of the computers and excluding any that may have generated an error during operation.

A fault-tolerant parallel processor (FTPP) architecture may provide replicated operation of processing elements, and may provide synchronization and data integrity functions. Such high-reliability systems include redundant computers such that the system may continue operation in light of a failure of one (or more) of the computers. In such systems, various computing elements may need to maintain a synchronized clock and/or provide for clock synchronization between the multiple redundant computers.

Fault-tolerant computing systems are designed to continue operating properly in the event of a failure of one or more components. Fault-tolerant systems can be robust to several possible types of failures, including but not limited to hard disk failures, input or output device failures, software bugs and errors, interface errors, operator errors, bad command sequences, single event upsets, single event latch-ups, and physical damage. Fault tolerant systems are useful in machines built to last a long time without any maintenance, such as space systems; computers that must be very dependable and require constant monitoring, such as monitor and control computers for nuclear power plants or supercollider experiments; and computers with high runtimes and heavy use, such as supercomputers for probability monitoring. However, the computing systems disclosed herein are not limited to these types of applications.

Referring to FIG. 1, there is illustrated a block diagram of a computing system 100 that includes four computers (or sub-systems) 110 and a communications channel 120 that allows the four computers 110 to communicate with each other. Various embodiments may include more or fewer than four computers. A system having more computers 110 may generally be capable of acceptable operation under conditions of multiple or more faults than a system of fewer computers 110. Accordingly, various embodiments of a computing system similar to the system 100 may have any number of computers and may be designed to accommodate various types or number of faults without departure from the aspects and embodiments described herein. The communications channel 120 may be of any suitable type, and may include a shared medium (for example such that when any of the computers transmits all the computers are capable of receiving) or may include dedicated media (for example, individual point-to-point communications channels between each pair of the computers, such as a mesh network).

In various embodiments, each of the computers 110 includes a synchronization component that maintains a synchronized clock with the other of the computers 110.

Accordingly, each of the computers 110 (when properly functioning) may include a synchronized clock that matches a similar synchronized clock in all of the other computers 110, within some tolerance or variance criterion. Various embodiments of systems and methods described herein provide a capability to maintain the synchronized clocks in a synchronized status.

Each of the computers 110 may include an internal or system clock, which may not be synchronized with the internal or system clocks of the other computers 110. Each of the system clocks may be driven or provided by an oscillator, for example, a local oscillator (LO), that provides an oscillating signal of a certain degree of stability, for example, accuracy, precision, to a counter that maintains a running total of the number of cycles of the oscillating signal, to within a maximum count at which time the counter may "rollover" to start again at zero. Accordingly, a counter driven by an oscillator may be a system clock that maintains a reference time (for example, in number of oscillator cycles). For example, in at least one embodiment, a local oscillator may be included to provide an oscillating signal (or clock signal) at a nominal frequency of 35 MHz, with an accuracy of ±50 ppm, and a counter having 48 bits of resolution may count the clock cycles of the oscillating signal. Accordingly, such a 48-bit counter driven by a 35 MHz oscillator increments by 35,000,000 every second and rolls over (for example, to start again at zero) approximately every 3 months (91.31 days). The value provided by the counter at any given time is the system clock.

To maintain a synchronized clock, each of the computers 110, or the synchronization component of each of the computers 110, may maintain an offset value that when added to the respective system clock provides the synchronized clock. In various embodiments, two separate oscillators, respectively of two of the computers 110, may be well-matched in that their frequencies have only a slight variance, and thus an offset value for the system clock of one of the computers to be "adjusted" to provide a synchronized clock (for example, synchronized with the other of the computers) may be substantially constant. By contrast, a slowly changing offset value (for example, slowly increasing or decreasing over time) suggests that one of the oscillators runs faster than the other. An offset value that changes over time, but within an accepted rate of change (for example, implying that the oscillators of two computers 110 are not running at exactly the same frequency), is accommodated by the systems and methods described herein.

In various embodiments, however, a rapidly changing offset value and/or an offset value that changes drastically from one moment to the next and/or changes at highly varying rates over time may indicate that the system clock (for example, the oscillator, counter, or other component) of at least one of the computers 110 is malfunctioning. Accordingly, systems and methods described herein may reject or ignore the clocking information from such a malfunctioning one of the computers 110. For example, at various times, all the computers 110 may maintain a synchronized clock that is synchronized to a system clock of a particular one of the computers 110, which is thereby the leader. In other words, each of the computers 110 may maintain a synchronized clock that is synchronized to a leader, and the leader may be a particular one of the computers 110. Accordingly, if the system clock of the leader is detected to be malfunctioning (for example, by errant behavior of the offset value described above), a new one of the computers 110 may be selected to be a new leader, and the various computers 110 may begin synchronizing with the new leader.

Figure 2:
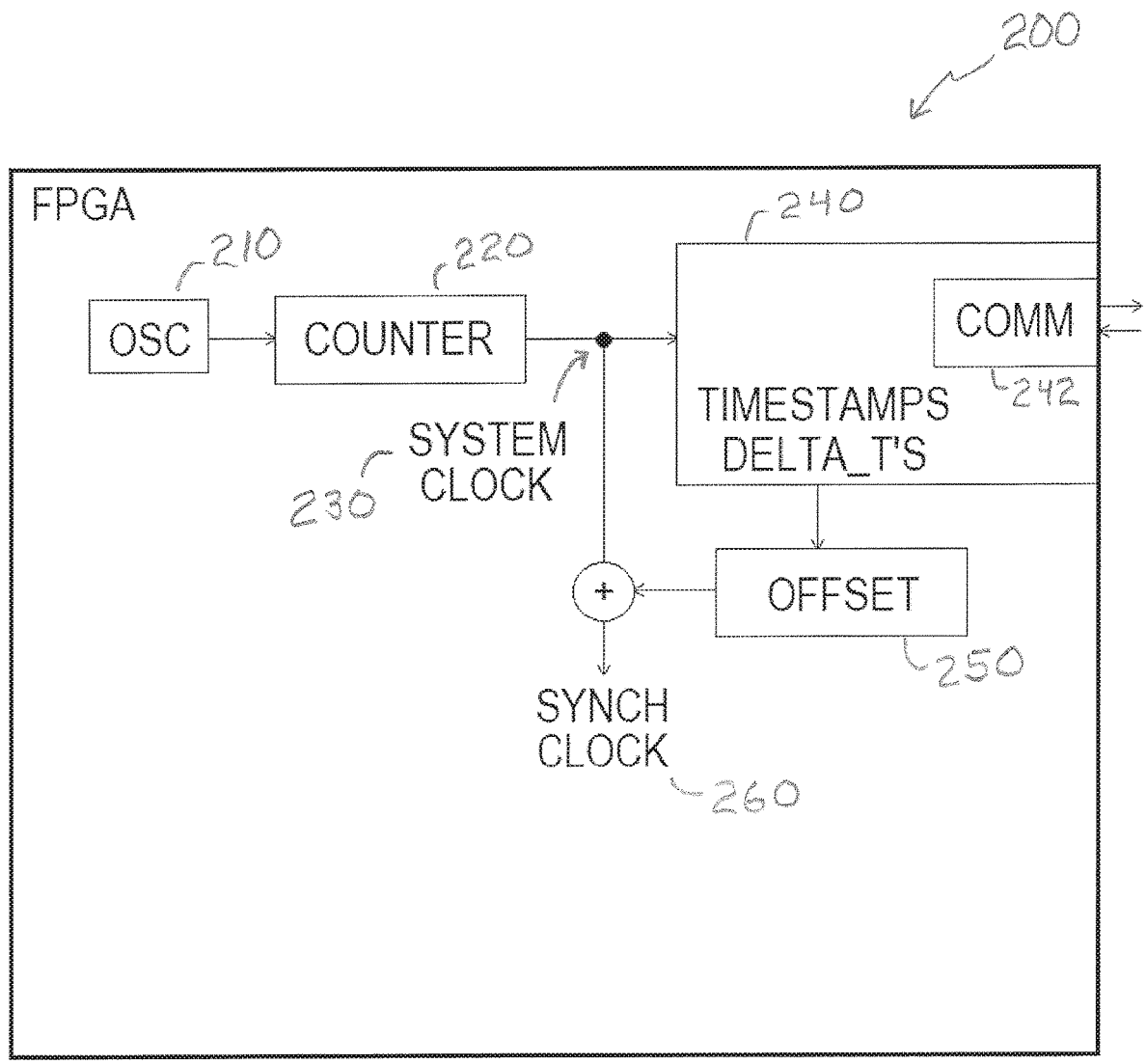
FIG. 2 is a schematic block diagram of an example component of a computer of a fault tolerant computing system.

FIG. 2 illustrates a block diagram of a component 200 that may be responsible for maintaining a synchronized clock in certain embodiments. In some embodiments, the component 200 may be implemented in a hardware form, such as an application-specific integrated circuit (ASIC) or as a field-programmable gate array (FPGA). For example, such hardware embodiments, or the like, may exhibit consistent processing times that contribute to accuracy of the synchronized clock. Other embodiments, however, may include varying degrees of hardware implementation and may include software or firmware instructions to be processed by a more generic processing component.

In various embodiments, the component 200 may include an oscillator 210 that drives a counter 220 to provide a system clock 230 (as described above). A timing sub-component 240 may maintain communications with others of the computers 110 (for example, via a communication interface 242 that couples to the communications channel 120) to determine an offset 250 that when added to the system clock 230 yields a synchronized clock 260. The offset 250 may, at various times, be a positive or negative value, for example, based upon whether the system clock 230 is behind or ahead of the leader's clock, respectively. The timing sub-component 240 communicates with the leader (for example, another one of the computers 110) to determine the proper value of the offset 250 that will cause the system clock 230 to "synchronize" with the leader's clock when modified by the offset 250, for example, by adding the offset 250 to the system clock 230, to provide the synchronized clock 260. In various examples, if the component 200 is a part of the computer 110 that is the leader, the offset may be zero, for example, because the system clock 230 of the leader is the synchronized clock 260. Accordingly, the leader's system clock 230 does not need to be modified.

Operation of the timing sub-component 240 is described to illustrate, in at least one embodiment, how a value is determined for the offset 250. At an example time, the computer 110a may be the leader to which the other computers 110 are to synchronize their clocks. Accordingly, each of the other computers 110b, 110c, 110d carries out communications that allow determination (as described in greater detail below) of a respective offset 250 having a value that, when added to their respective system clock 230, provides a synchronized clock 260 that is synchronized with the system clock 230 of the leader computer 110a. Accordingly, the synchronized clock 260 maintained at each respective computer 110 will be synchronized with each of the synchronized clocks 260 at the other of the computers 110.

In at least one embodiment, each of the computers 110 includes a component 200 responsible for maintaining the synchronized clock 260. As for timing information communicated over the communications channel 120, such may be variously described herein as being an equivalent communication by any of the computer 110, the synchronization component 200 of the respective computer 110, or the timing sub-component 240 of the respective component 200. Accordingly, timing data and/or information communicated by and between any of the computers 110 may be communicated by and between respective components 200 and sub-components 240 of the computers 110, for example, via respective communication interfaces 242 and conveyed by the communications channel 120. For ease of illustration herein, the communications channel 120 is exemplified herein as providing conveyance from each of the computers 110 to every other of the computers 110 at once (for example, such as a shared media), but dedicated channels between individual pairs of the computers 110 are capable of providing similar conveyance of transmitted data, as will be understood by one of skill in the art.

Returning to an example in time of the computer 110a being a leader to which the other computers 110 will synchronize, an illustrative description of the operation of the computer 110b to synchronize with the computer 110a is presented. Accordingly, the computer 110b (for example, via a respective component 200) operates to provide a synchronized clock 260 which matches, within some variance or tolerance criterion, with the system clock 230 of the leader computer 110a.

Figure 3:
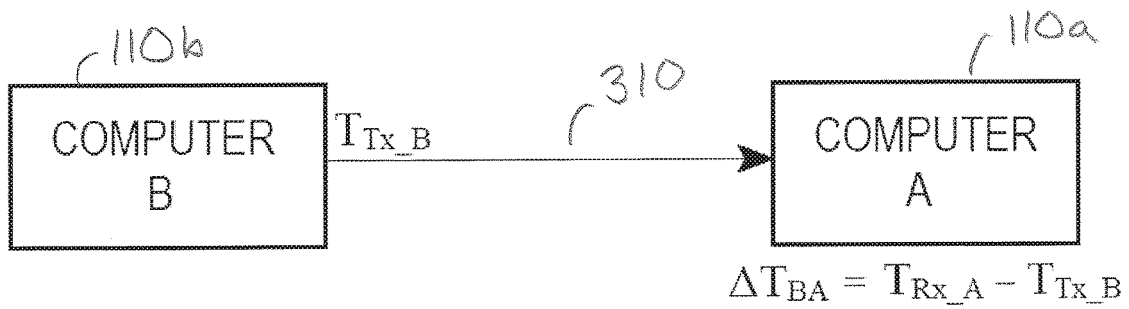
FIG. 3 is a schematic diagram of an example communications exchange of timing information between two example computers of a fault tolerant computing system.
Figure 3:
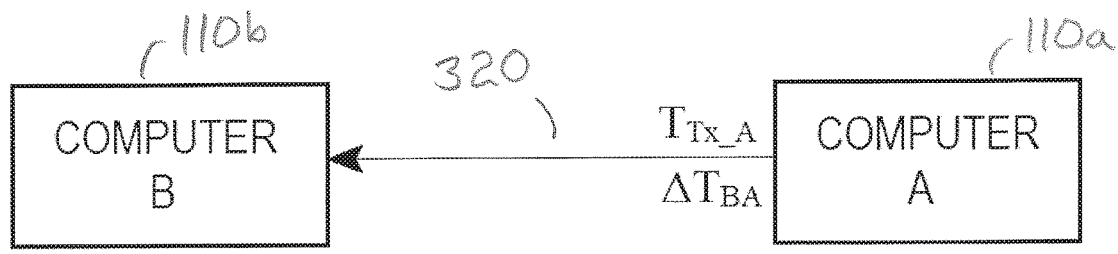

As illustrated by FIG. 3, the computer 110b transmits a communication 310 (for example, via a packet, frame, datagram, and so forth) which includes the time of the transmission, $T_{Tx\_B}$, based upon the system clock 230 of the computer 110b. The leader computer 110a receives the transmission and determines a time differential ($\Delta T_{BA}$) value based on the receive time, $T_{Rx\_A}$, according to the leader's system clock 230. Accordingly, the time difference $\Delta T_{BA} = T_{Rx\_A} - T_{Tx\_B}$ represents the time difference as determined by computer A based on the received time (according to A's system clock 230) relative to the transmitted time (according to B's system clock 230). Further, the time difference $\Delta T_{BA}$ includes various processing and transmission times for the transmission from B to A and includes the offset of A's clock relative to B's clock (for example, if A's clock is ahead of B's clock, the amount by which A's clock is ahead is included in the $\Delta T_{BA}$ value determined by computer A; if A's clock is behind B's clock, the offset is still included but may be a negative value). Accordingly, while $\Delta T_{BA}$ may calculated by computer 110a as a difference between a pair of transmit and receive times, the value may be equivalently expressed as $\Delta T_{BA} = TT_{BA} + O_{BA}$, where $TT_{BA}$ is the transit time (including processing at each of the computers) for the information to transit from B to A, and $O_{BA}$ is the offset value of A's system clock 230 relative to B's system clock 230 (for example, positive if A is ahead of B, negative if A is behind B).

Further illustrated in FIG. 3, the computer 110a transmits a communication 320 that is received by the computer 110b. The communication 320 includes the time of the transmission, $T_{Tx\_A}$, based upon the system clock 230 of the computer 110a, and includes the time difference $\Delta T_{BA}$ that was determined by the computer 110a. Accordingly, the computer 110b may determine a new time difference, $\Delta T_{AB} = T_{Rx\_B} - Tl_{Tx\_A}$, that represents the time difference as determined by computer B based on the received time (according to B's system clock 230) relative to the transmitted time (according to A's system clock 230). Similar to the above time difference (from B to A) determined by the computer 110a, the new time difference (for example, from A to B) is determined by the computer 110b. Similar to the above, the new time difference may also be expressed as a transit time and an offset, $\Delta T_{AB} = TT_{AB} + O_{AB}$.

In various embodiments, the computers 110 are of identical or nearly identical nature. Accordingly, it may be presumed and/or may be enforced by design that processing and transmission of timing information from A to B may take approximately the same amount of time as processing and transmission of timing information from B to A, for example, $TT_{BA} \approx TT_{AB}$. Further, the offset of A's system clock relative to B's is the same as B's relative to A's, with opposite sign, for example, $O_{AB} = -O_{BA}$. Accordingly, subtracting the new time difference in one direction (for example, calculated by the computer 110b) from the earlier time difference in the opposite direction (for example, calculated by the computer 110a), may yield an approximate offset 250 to within a certain allowed variance criterion, as illustrated by Eq. (1).

$$\Delta T_{BA} - \Delta T_{AB} = (TT_{BA} + O_{BA}) - (TT_{AB} + O_{AB}) \approx 2 O_{BA} \quad (1)$$

Accordingly, after the exchange of the communications 310, 320, the computer 110b may calculate an offset 250 that may be added to the system clock 230 of the computer 110b to provide a synchronized clock 260 that is synchronized with the leader computer 110a. Similarly, each of the other computers 110 may carry out a similar exchange of communications with the computer 110a such that all the computers 110 are provided with a synchronized clock 260 which is synchronized with the leader computer 110a. Further, each of the computers 110 may at intervals conduct further exchange of communications, for example, similar to those illustrated in FIG. 3, such that each of the computers 110 may continuously update an appropriate offset 250 to the leader computer 110a to maintain their respective synchronized clock 260. For example, the offset 250 may drift due to the leader's system clock 230 being faster or slower than the system clock 230 of any respective other one of the computers 110. Accordingly, the value of an offset 250 indicates a difference in system clocks at a particular time, and a changing value of the offset 250 over time indicates a difference in clock rates (for example, oscillator frequency) between the leader computer 110a and a respective one of the other computers 110.

As described above, each of the computers 110 may maintain a respective synchronized clock 260 that is synchronized with a leader or master clock, such as the system clock 230 of the leader computer 110a. Each of the computers 110 exchanges messages with the leader (for example, computer 110a) and maintains $\Delta T$ values from itself to the leader and from the leader to itself, from which the respective computer 110 may calculate or determine an appropriate offset 250, as described above. Each respective computer 110 then maintains synchronization with the leader by adjusting a respective system clock 230 by the determined offset 250, as further described above. In some embodiments, timing information may be communicated, and $\Delta T$ values may be calculated and/or stored by a subcomponent 240, as illustrated in FIG. 2, which may include processing capability for calculations and memory for storage of $\Delta T$ values and/or offset values. Various embodiments may communicate, calculate, determine, and store such information in differing ways.

According to various embodiments, a system similar to system 100 in FIG. 1 may establish a leader from among the computers 110 and may exchange timing information (as described above) to synchronize with the leader's clock. In further embodiments, the computers may maintain additional timing information to provide capability for a rapid recovery or failover to another one of the computers as a new leader, such as in case of failure of the leader computer.

Figure 4:
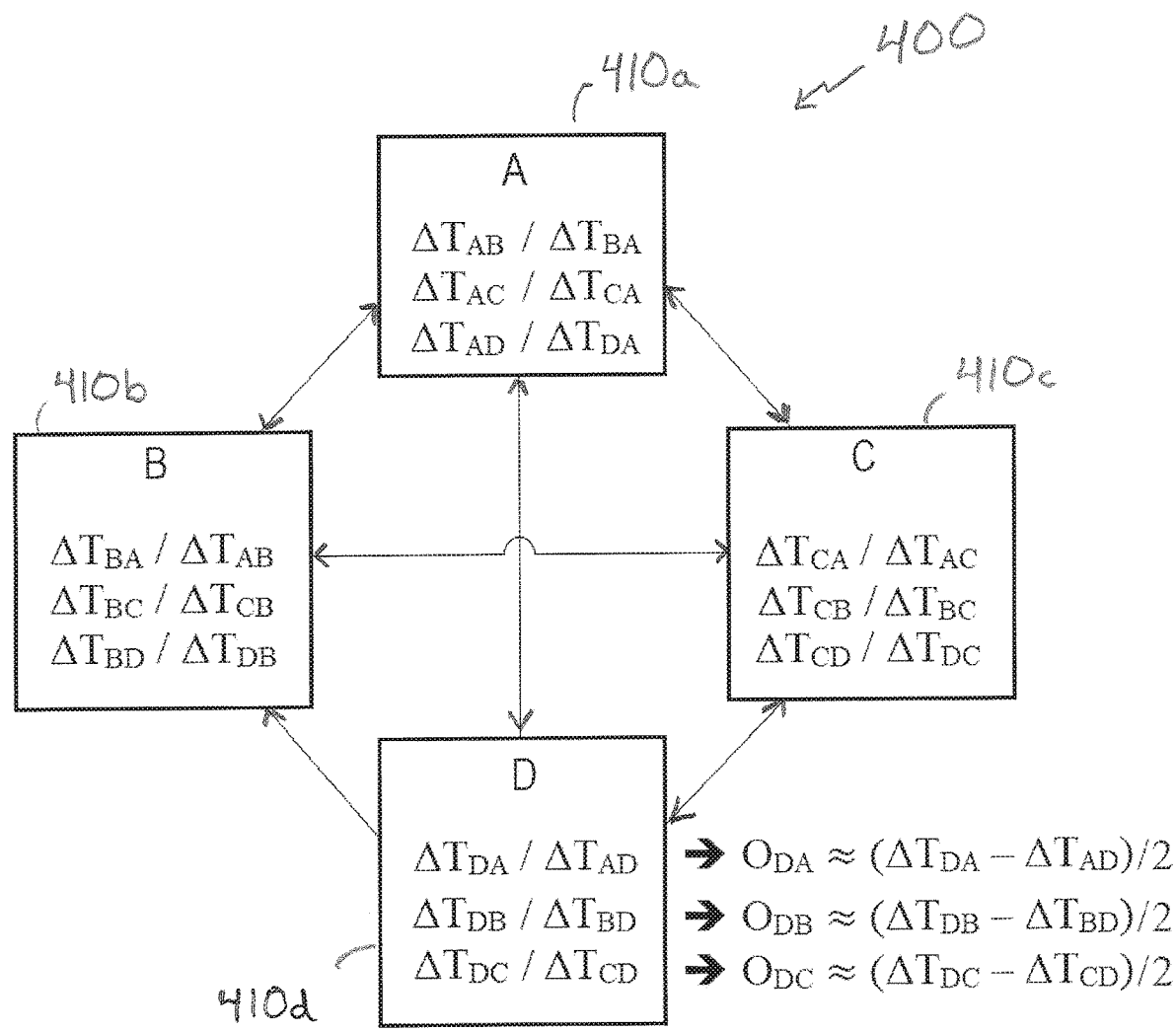
FIG. 4 is a schematic block diagram of another example fault tolerant computing system.

Illustrated in FIG. 4 is a block diagram of a system 400 that includes a number of computers 410 (as shown, four computers 410, but may include more or fewer computers in various embodiments), each of which maintains $\Delta T$ values relative to a number of the other computers 410 and not just relative to a leader. Accordingly, any of the computers 410 may "convert" or change their synchronized clock to be synchronized to any of the other computers at any moment, in a rapid time, and in as short as one clock cycle in some embodiments. Rapid failover to another leader clock is made possible because $\Delta T$ values and, optionally, offset values, to a plurality of the other computers 410 are maintained by the computers 410. For example, each of the computers 410 may determine ΔT values to each of the other computers 410 at regular intervals and store the ΔT values in a memory, such that the stored ΔT values are immediately available to calculate an offset value to synchronize with a different leader clock. In some embodiments, any of the computers 410 may at regular intervals calculate offset values to multiple of the other computers 410 (or other potential leader clocks), for example, from the stored ΔT values, and may store the calculated offset values such that the offset values are immediately available to synchronize with a different leader clock. Accordingly, the system 400 may quickly establish a new leader (for example, a selected one of the computers 410, or another clock source in various embodiments) and all be synchronized to the new leader with minimal delay.

For example, and with continued reference to FIG. 4, each of the computers 410 may maintain a table of ΔT values, the ΔT values being as described above and representative of one-way measured time differences that include transit time and offsets between the system clocks 230 of the respective computers 410. Accordingly, for the example of FIG. 4 with four computers 410, each of the computers 410 may maintain or store a table of six ΔT values, for example, a pair of ΔT values for each of the other (three) computers 410 to which it may need to synchronize. For example, the computer 410d maintains a first pair of ΔT values representing two-way time differentials between the computer 410d and the computer 410a, a second pair of ΔT values representing two-way time differentials between the computer 410d and the computer 410b, and a third pair of ΔT values representing two-way time differentials between the computer 410d and the computer 410c. Accordingly, the computer 410d may rapidly determine an offset to synchronize with any of the system clocks 230 of the computers 410a, 410b, 410c, and in some embodiments may maintain a table of such offset values, for example, by calculating the offset values at routine intervals based upon the ΔT values. Accordingly, rapid synchronization to any system clock is made possible by routine communication of timing information (for example, communications 310, 320 of FIG. 3) to multiple potential leaders to maintain a table of ΔT values and/or offset values. Accordingly, the system 400 may rapidly recover from a failure of a leader clock by re-synchronizing with a system clock of a new leader. In various embodiments, a new leader or a "next leader" may be previously identified, configured, and/or agreed upon among the computers 410, for example.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A computing system comprising:
   an oscillator configured to provide an oscillating signal;
   a counter coupled to the oscillator and configured to maintain a running total of cycles of the oscillating signal, the running total of cycles being a system clock;
   a communications interface configured to send and receive information; and
   a processing component configured to:
   communicate with at least two other computing systems;
   determine a time differential with respect to each of the at least two other computing systems;
   maintain a synchronized clock with a selected one of the at least two other computing systems;
   monitor for a failure criterion with respect to the selected computing system; and
   re-synchronize the synchronized clock with an alternate one of the at least two other computing systems using the time differential with respect to the alternate one of the at least two other computing systems upon detecting the failure criterion, wherein the failure criterion is satisfied where a rate at which a first offset value changes exceeds a threshold, the first offset value being derived from the time differential with respect to the selected computing system.

2. The computing system of claim 1, wherein the processing component is further configured to:
   maintain the synchronized clock based upon the system clock and the first offset value; and
   replace the first offset value with a second offset value derived from the time differential with respect to the alternate computing system responsive to detecting the failure criterion.

3. The computing system of claim 2, wherein the processing component is further configured to derive the first offset value based upon a first time differential to the selected computing system and a second time differential from the selected computing system.

4. The computing system of claim 3, wherein the processing component is further configured to derive the first offset value as an average of a difference between the first time differential and the second time differential.

5. The computing system of claim 2, wherein the processing component is further configured to maintain derived values of the first offset value and the second offset value simultaneously.

6. The computing system of claim 1, wherein the failure criterion is based upon the first offset value.

7. A method of operating a computing system having a system clock, the method comprising:
   communicating with at least two other computing systems;
   determining a time differential with respect to each of the at least two other computing systems;
   maintaining a synchronized clock with a selected one of the at least two other computing systems;
   monitoring for a failure criterion with respect to the selected computing system;
   determining that the failure criterion is satisfied where a rate at which a first offset value changes exceeds a threshold, the first offset value being derived from the time differential with respect to the selected computing system; and
   re-synchronizing the synchronized clock with an alternate one of the at least two other computing systems using the time differential with respect to the alternate one of the at least two other computing systems upon detecting the failure criterion.

8. The method of claim 7, further comprising:
   maintaining the synchronized clock based upon the system clock and the first offset value; and
   replacing the first offset value with a second offset value derived from time differentials with respect to the alternate computing system responsive to detecting the failure criterion.

9. The method of claim 8, further comprising deriving the first offset value based upon a first time differential to the selected computing system and a second time differential from the selected computing system.

10. The method of claim 9, further comprising deriving the first offset value as an average of a difference between the first time differential and the second time differential.

11. The method of claim 8, further comprising maintaining derived values of the first offset value and the second offset value simultaneously.

12. The method of claim 7, wherein the failure criterion is based upon the first offset value.

13. A non-transitory computer-readable medium storing thereon sequences of computer-executable instructions for operating a computer system having a system clock, the sequences of computer-executable instructions including instructions that instruct at least one processor to:
communicate with at least two other computing systems;
determine a time differential with respect to each of the at least two other computing systems;
maintain a synchronized clock with a selected one of the at least two other computing systems;
monitor for a failure criterion with respect to the selected computing system; and
re-synchronize the synchronized clock with an alternate one of the at least two other computing systems using the time differential with respect to the alternate one of the at least two other computing systems upon detecting the failure criterion, wherein the failure criterion is satisfied where a rate at which a first offset value changes exceeds a threshold, the first offset value being derived from the time differential with respect to the selected computing system.

14. The non-transitory computer-readable medium of claim 13, wherein the instructions are further configured to instruct the at least one processor to:
maintain the synchronized clock based upon the system clock and the first offset value; and
replace the first offset value with a second offset value derived from time differentials with respect to the alternate computing system responsive to detecting the failure criterion.

15. The non-transitory computer-readable medium of claim 14, wherein the instructions are further configured to instruct the at least one processor to derive the first offset value based upon a first time differential to the selected computing system and a second time differential from the selected computing system.

16. The non-transitory computer-readable medium of claim 15, wherein the instructions are further configured to instruct the at least one processor to derive the first offset value as an average of a difference between the first time differential and the second time differential.

17. The non-transitory computer-readable medium of claim 14, wherein the instructions are further configured to instruct the at least one processor to maintain derived values of the first offset value and the second offset value simultaneously.

* * * * *